United States Patent
Ryou (10) Patent No.: US 9,831,273 B2
(45) Date of Patent: Nov. 28, 2017

(54) FLEXIBLE SINGLE-CRYSTALLINE SEMICONDUCTOR DEVICE AND FABRICATION METHODS THEREOF

(71) Applicant: University of Houston System, Houston, TX (US)

(72) Inventor: Jae-Hyun Ryou, Houston, TX (US)

(73) Assignee: UNIVERSITY OF HOUSTON SYSTEM, Houston, TX (US)

(*) Notice: Subject to any disclaimer, the term of this patent is extended or adjusted under 35 U.S.C. 154(b) by 0 days.

(21) Appl. No.: 14/579,360

(22) Filed: Dec. 22, 2014

(65) Prior Publication Data

US 2015/0179447 A1    Jun. 25, 2015

Related U.S. Application Data

(60) Provisional application No. 61/920,361, filed on Dec. 23, 2013.

(51) Int. Cl.
| | |
|---|---|
| *H01L 29/04* | (2006.01) |
| *H01L 27/12* | (2006.01) |
| *H01L 21/02* | (2006.01) |
| *H01L 21/20* | (2006.01) |

(52) U.S. Cl.
CPC ........ *H01L 27/12* (2013.01); *H01L 21/02002* (2013.01); *H01L 21/2007* (2013.01); *H01L 27/1266* (2013.01); *H01L 29/04* (2013.01); *H01L 21/02639* (2013.01)

(58) Field of Classification Search
CPC ......... H01L 21/02664; H01L 21/02639; H01L 27/12; H01L 29/04

USPC ....................................................... 257/798
See application file for complete search history.

(56) References Cited

U.S. PATENT DOCUMENTS

| | | | |
|---|---|---|---|
| 4,760,036 A | 7/1988 | Schubert | |
| 5,814,262 A * | 9/1998 | Ketcham | C04B 35/62218 264/316 |
| 6,380,108 B1 * | 4/2002 | Linthicum | C30B 25/02 257/103 |
| 8,274,097 B2 * | 9/2012 | Cheng | H01L 21/02532 257/190 |
| 8,937,366 B1 * | 1/2015 | Han | H01L 21/02455 257/522 |
| 2002/0115267 A1 * | 8/2002 | Tomiya | B29C 43/222 438/478 |
| 2002/0192959 A1 * | 12/2002 | Shibata | C30B 25/02 438/689 |
| 2004/0245535 A1 * | 12/2004 | D'Evelyn | H01L 33/32 257/94 |
| 2007/0085953 A1 | 4/2007 | Alford et al. | |
| 2009/0149005 A1 * | 6/2009 | Tauzin | C30B 25/04 438/480 |

(Continued)

OTHER PUBLICATIONS

PCT/US2014/071912 International Search Report and Written Opinion dated Apr. 23, 2015 (14 p.).

*Primary Examiner* — Christine Enad
(74) *Attorney, Agent, or Firm* — Conley Rose, P.C.

(57) ABSTRACT

Systems and methods herein relate to the fabrication of a single-crystal flexible semiconductor template that may be attached to a semiconductor device. The template fabricated comprises a plurality of single crystals grown by lateral epitaxial growth on a seed layer and bonded to a flexible substrate. The layer grown has portions removed to create windows that add to the flexibility of the template.

10 Claims, 6 Drawing Sheets

(56) References Cited

U.S. PATENT DOCUMENTS

| | | |
|---|---|---|
| 2009/0221131 A1 | 9/2009 | Kubota et al. |
| 2009/0289255 A1* | 11/2009 | Lee .................... H01L 27/1248 257/59 |
| 2011/0073995 A1* | 3/2011 | Nomura .............. H01L 21/0242 257/615 |
| 2011/0156212 A1* | 6/2011 | Arena ................... H01L 21/187 257/615 |
| 2012/0168710 A1 | 7/2012 | Wang et al. |
| 2013/0125970 A1* | 5/2013 | Ko ......................... G02B 6/136 136/256 |
| 2013/0134480 A1 | 5/2013 | Hydrick et al. |
| 2015/0155165 A1* | 6/2015 | Hata ................... H01L 21/2007 257/623 |
| 2015/0194337 A1* | 7/2015 | Moriceau ............ H01L 21/2007 438/459 |

\* cited by examiner

FLEXIBLE SINGLE-CRYSTALLINE SEMICONDUCTOR DEVICE AND FABRICATION METHODS THEREOF

CROSS-REFERENCE TO RELATED APPLICATIONS

This application claims benefit of U.S. provisional patent application Ser. No. 61/920,361 filed Dec. 23, 2013, and entitled "Flexible Single-Crystalline Semiconductor Device Fabrication and Methods Thereof," which is hereby incorporated herein by reference in its entirety for all purposes.

STATEMENT REGARDING FEDERALLY SPONSORED RESEARCH OR DEVELOPMENT

Not applicable.

BACKGROUND

Background of the Technology

As the electronics market has grown over the past decades, the demand for semiconductors has increased significantly. The type of semiconductor selected for a particular application depends upon the requirements of that application. Semiconductors may differ in multiple ways, some more appropriate for various applications than others, and one example of this is the manufacture of flexible and rigid semiconductors. Flexible semiconductors may be employed in applications such as computer or mobile device displays as well as radio frequency identification tags (RFID) and smart card technology. Rigid semiconductors may be employed in portable electronic devices and other applications.

BRIEF SUMMARY OF THE DISCLOSURE

In an embodiment, a method of fabricating semiconductors comprising: disposing a first layer in contact with a first substrate; disposing a mask in contact with a plurality of regions of the first layer, wherein the mask has a first side and a second side, wherein the first side is in contact with the first layer, wherein the second side is opposite the first side, wherein the mask comprises a plurality of sections, and wherein each pair of adjacent mask sections forms an opening. The embodiment further comprising: growing a second layer by lateral epitaxial overgrowth through at least some openings formed by the pairs of adjacent mask sections at an angle normal to the mask and on the second side of the mask, and wherein at least a portion of the second layer comprises a single crystalline structure; removing at least a portion of the second layer, wherein the removed portion is part of the second layer that grew through an least one opening of the plurality of openings; bonding a second substrate to the second layer, wherein the second substrate is a flexible substrate; removing the mask; and removing the first substrate.

In an embodiment, a semiconductor template comprising: a semiconductor layer bonded to a flexible substrate; wherein the semiconductor layer is formed by lateral epitaxial overgrowth; and wherein the semiconductor layer comprises a single-crystalline structure grown by lateral epitaxial overgrowth.

In another embodiment, a semiconductor template comprising: a flexible substrate; and a semiconductor layer comprising a single-crystalline structure bonded to said flexible substrate.

Embodiments described herein comprise a combination of features and characteristics intended to address various shortcomings associated with certain prior devices, compositions, systems, and methods. The various features and characteristics described above, as well as others, will be readily apparent to those of ordinary skill in the art upon reading the following detailed description, and by referring to the accompanying drawings.

BRIEF DESCRIPTION OF THE DRAWINGS

For a detailed description of the exemplary embodiments disclosed herein, reference will now be made to the accompanying drawings in which.

DETAILED DESCRIPTION OF EXEMPLARY EMBODIMENTS

The following discussion is directed to various exemplary embodiments. However, one of ordinary skill in the art will understand that the examples disclosed herein have broad application, and that the discussion of any embodiment is meant only to be exemplary of that embodiment, and not intended to suggest that the scope of the disclosure, including the claims, is limited to that embodiment.

The drawing figures are not necessarily to scale. Certain features and components herein may be shown exaggerated in scale or in somewhat schematic form and some details of conventional elements may not be shown in interest of clarity and conciseness.

In the following discussion and in the claims, the terms "including" and "comprising" are used in an open-ended fashion, and thus should be interpreted to mean "including, but not limited to . . . ."

A semiconductor is a material that comprises a metallic material disposed in contact with an insulating material where there is conductivity between the metallic layer and the insulator layer. Conventionally, semiconductors are either single-crystalline structure on a rigid substrate or multi-crystalline structure on a flexible substrate. Semiconductors may be used in a variety of solid state electronic including solar technology, light-emitting diodes (LEDs), as well as transistors and integrated circuits. Conventionally, flexible electronics have flexible semiconductors that may comprise polycrystalline or amorphous structures. These flexible semiconductors may be limited by mechanical properties and temperature restraints and may not be ideal to use for high temperature, high pressure, or repeated pressure applications where the crystalline structures could deteriorate rapidly, and potentially catastrophically, depending upon where the semiconductor was employed. As such, even if flexible properties may be desirable or even preferable, rigid semiconductors may be employed in applications where higher speed and/or as resistance to higher temperatures and mechanical stresses than conventional flexible semiconductors are capable of providing. Disclosed herein is a flexible semiconductor that is not amorphous nor polycrystalline but is single-crystalline since that structure is able to withstand significantly higher, sustained temperatures and strain than amorphous or polycrystalline materials.

Semiconductor technology provides a desirable platform for present-day information technology and next-generation green sustainable technology in the areas including electronics, optoelectronics, solid-state lighting, and photovoltaics, etc. There are two different developed technology platforms in the semiconductor materials and devices.

Conventional semiconductor technology is based on high-purity single-crystal "native" semiconductor substrates. For example, silicon (Si) MOS-FETs (metal-oxide-semiconductor field-effect transistors) and MOS-C (MOS capacitor), which are critical devices in electronic and computing systems, are processed on the substrates with the same materials and crystalline-defect-free single-crystal structure. Also, high-efficiency photovoltaic solar cells are realized only on single-crystal Si, germanium (Ge) or gallium arsenide (GaAs) substrates. In order to achieve devices with high performance characteristics such as high conversion efficiency, high current, high speed, etc., single crystalline semiconductor materials on the single-crystal substrate may be preferable.

Since the technology discussed herein is based on single-crystal substrates, the size and manufacturing costs are constrained by substrate-typed based technology. That is, a first conventional application may use a rigid, single-crystalline substrate when a flexible substrate would be more desirable because of the lack of single-crystalline flexible substrate semiconductors. In order to reduce the manufacturing cost, scaling-up (increasing) of substrate size has been one of the major thrusts for technology development. In the case of Si substrates, in some embodiments, a substrate size of up to 18" is commercially available. While the larger substrates will bring the manufacturing cost down further, the device manufacturing cost is still higher than another technology platform that employs flexible substrates. Also, the single-crystal semiconductor substrates are brittle and conventionally could not be used in flexible or stretchable materials and devices.

A second conventional technology is based on non-single crystal materials such as organic, amorphous, or polycrystalline semiconducting materials. The materials and devices do not have to be implemented on single-crystal substrates. Therefore, the substrate size does not have to be limited to maximum available size of single-crystal substrates. The substrates used in this technology platform are less expensive and easy to be scaled up to larger sizes to reduce manufacturing costs. This technology platform can also be used in flexible and stretchable electronics and photonics. However, this technology is fundamentally limited by crystalline quality of materials. Due to crystal defects in the materials, the mobility of carriers are generally very low and photon-electron conversion efficiencies are also very low, mainly due to crystalline imperfection since the structures are polycrystalline or amorphous material. Therefore, these conventional platforms may provide low-cost versatile applications but with compromised performance characteristics.

Table 1 summarizes characteristics of two conventional technology platforms. As shown in Table 1, each technology platform has distinct advantages and disadvantage. Therefore, these two technology platforms have been developed to target two different applications and markets. Even though they are trying to overcome their own limitations—single-crystal platforms for wafer scaling and cost reduction, and non-single crystal platforms for higher performance characteristics, they cannot overcome their fundamental limitations.

TABLE 1

| | Single-Crystalline Materials | Organic, Amorphous, or poly-crystalline materials |
| --- | --- | --- |
| Substrate | Single crystal | Non-single crystal |
| Cost | High | Low |
| Versatility | Brittle | Flexible |
| Performance Characteristics | High | Compromised |

In order to address technical challenges in next-generation electronics and photonics with the goal of providing improved performance characteristics, functionalities, and scalabilities, while reducing manufacturing cost, a whole new technology platform development is desirable.

Disclosed are flexible single-crystalline semiconductor materials and devices and methods of fabricating those semiconductor devices. These flexible, single-crystalline structures have been fabricated in order to address technical challenges in next-generation electronics and photonics. The methods and systems disclosed herein are intended to offer single-crystalline, flexible semiconductors with improved performance characteristics, and functionalities that are also scalable, while reducing manufacturing cost typically associated with the manufacture of single-crystalline semiconductors.

The hybrid flexible templates discussed herein, which may be referred to herein as templates or semiconductor templates, employ at least one single-crystalline semiconductor thin-film layer. This layer serves as a high-quality crystalline-defect-free flexible platform for high-performance semiconductor device structures with a focus on manufacturing processes of the hybrid flexible templates. The combination of (1) a free-standing high-quality semiconductor thin-film layer on a mask grown by lateral epitaxial overgrowth, (2) a semiconductor layer transfer to a flexible template, and (3) semiconductor substrate separation, are discussed herein with respect to the fabrication of hybrid flexible templates.

Lateral epitaxial overgrowth may be described as local epitaxial growth which initially occurs in the direction normal to the surface of the substrate, but then proceeds preferentially in the direction parallel to the surface of the substrate. Vertical growth starts from the single-crystal seed area, but, in contrast, lateral growth may continue over non-crystalline portions of the substrate. For example, if a first side of a mask is in contact with a seed layer, the lateral growth may occur over the mask on the second side of the mask.

The products produced using new design and fabrication processes disclosed herein are intended to provide a new technological platform that can overcome the technological limitations in crystalline-defect-bearing materials of currently developed flexible devices with compromised performance characteristics. This new technology is also directed at overcoming the economic limitations in high-quality semiconductor devices on single-crystalline substrates with rigid and fragile mechanical properties and high manufacturing cost.

The design and processes described in this disclosure open up both new technical and market opportunities by offering: (1) single-crystal semiconductor materials on large-area flexible substrates, (2) high-performance electronic and photonic devices with versatile applications, (3) high-performance flexible and stretchable electronic and photonic devices, (4) reduction in manufacturing cost, (5) easy scalability.

Figure 1:
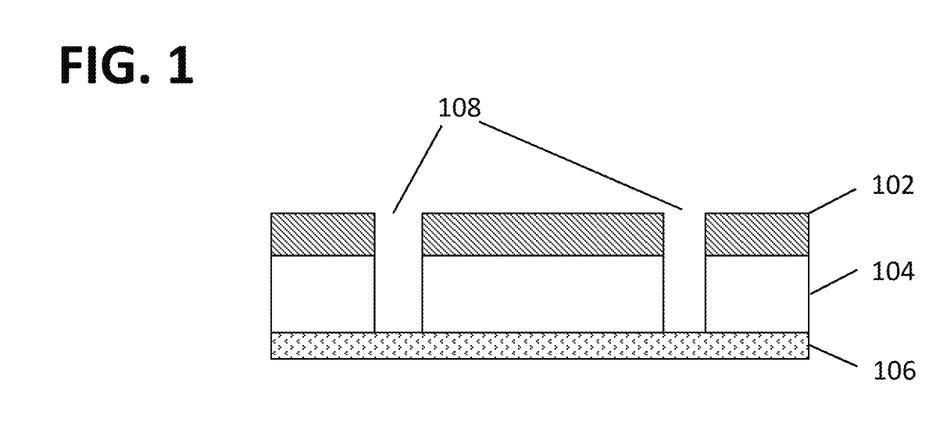
FIG. 1 is an illustration of a cross-section of a semiconductor device manufactured according to certain embodiments of the present disclosure.

In this disclosure, a new structure is discussed which consists of different layers that forms a hybrid template with high-quality, that is, crystalline-defect-free single-crystal semiconductor materials and device structures on a flexible substrate. FIG. 1 is an illustration of the structure of a flexible, single-crystalline semiconductor. The structure 100 in FIG. 1 comprises a flexible substrate 106 bonded to a plurality of single crystals 104, each of which is attached to or includes (i.e. manufactured as one piece) a semiconductor device 102. The portions of the structure 100 in FIG. 1 that are referred to herein as a template may comprise the flexible substrate 106 and the plurality of single crystals 104. The structure 100 provides both high-quality materials and flexibility that combine to give the performance properties that may be achieved by conventional methods only by using a rigid substrate. A lateral gap 108 between each plurality of single crystals 104 and the semiconductor device 102 is a result of the fabrication process discussed in detail below. This lateral gap 108 provides an improved flexibility of the whole structure 100 as well as natural device isolation between the devices. In an embodiment, the semiconductor device comprises multiple layers and regions of different semiconductor materials to provide various device structures for the purpose and application of the device, and may be deposited on and embedded in the semiconductor template as illustrated comprised of the plurality of single crystals 104 and the flexible substrate 106 by epitaxial growth of heterostructures comprising different layers of materials, selective diffusion of atoms, ion implantation, and other methods depending upon the types of devices including at least transistors, light emitters, light detectors, and solar cells.

Figure 2A:
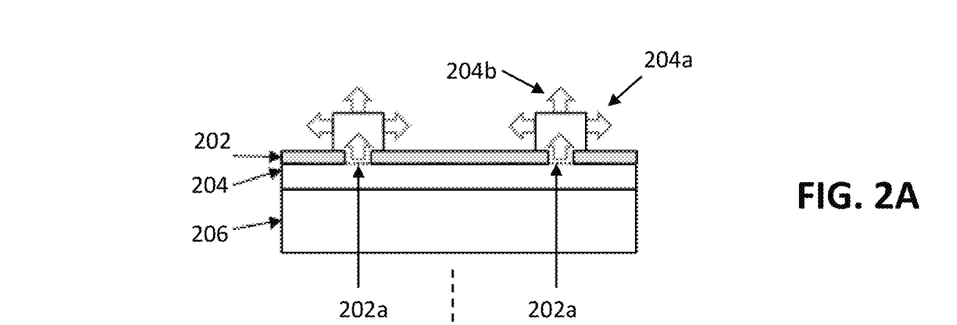
FIG. 2A-2F are a series of illustrations of cross-sections of stages in the fabrication of a flexible single crystalline semiconductor according to certain embodiments of the present disclosure.

FIGS. 2A-2F illustrate cross-sections of stages of fabrication of a single-crystalline flexible semiconductor. FIGS. 2A-2F schematically show the process of manufacturing a single-crystalline flexible semiconductor template. This process comprises lateral epitaxial overgrowth using a first substrate and a seed layer, etching of window area, transfer of a semiconductor layer to a flexible substrate, and separation of the first substrate. The process may further include attachment of this template comprising the single crystalline layer and the flexible substrate to a semiconductor device as shown in FIG. 1. In FIG. 2A, a mask 202 comprises a first side and a second side. The first side of the mask 202 is in contact with a semiconductor layer 204 which is in contact with a semiconductor substrate 206. The semiconductor substrate 206 may comprise semiconductor glass, metallic material, ceramic material, polymer, or combinations thereof. In some embodiments, the semiconductor comprises at least one of silicon, germanium, GaAs, InP, GaSb, InAs, SiC, GaN, AlN, corundum, ceramic, glass, metallic material, and combinations thereof. It is appreciated that, in a first embodiment, the mask 202 may be disposed on top of the semiconductor layer 204 and that, in a second embodiment, the semiconductor layer 204 may be disposed on the mask 202, and subsequent layers formed, disposed, and removed accordingly.

In either embodiment, the mask 202 may be comprised of a plurality of sections which may also be referred to as portions or regions that ultimately are in contact on a first side of each section of the mask 202 with at the semiconductor layer 204. There is a plurality of openings 202a between the sections of the mask 202. The semiconductor layer grows 204a as indicated in FIG. 2A through the plurality of openings 202a through the openings 202a and on to the second side of the mask 202a. This growth is referred to as lateral epitaxial overgrowth since the growth propagates in a direction perpendicular to the semiconductor substrate 206 and to the original direction of growth. In an embodiment, the lateral epitaxial overgrowth may be carried out by vapor deposition which may comprise deposition conditions of temperatures of about 200° C. to about 1500° C. The deposition conditions may also comprise the use of vacuum, atmospheric and above-atmospheric pressures for the control of ratios between the normal vertical epitaxial growth 204b and the lateral epitaxial overgrowth 204a. These parameters may be selected depending on a target geometry and a target dimension of the plurality of single crystals 104 of the templates.

Figure 2B:
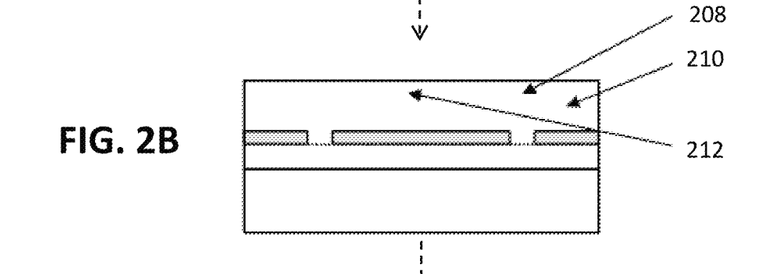

FIG. 2B is a cross-sectional overview of a result of lateral epitaxial overgrowth 204a and normal vertical epitaxial growth 204b, the start of which is shown in FIG. 2A. This lateral epitaxial overgrowth forms what may be referred to as a second semiconductor layer 212 that comprises areas that may be referred to as windows 208 and wings 210. The windows 208 which may also be referred to as window regions 208 grow through the plurality of openings 202a and the wings 210 grow in contact with the second side of the mask 202.

Figure 2C:
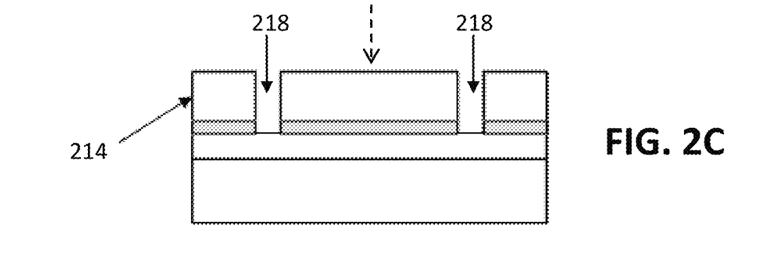

The semiconductor layer 204 in FIG. 2A may be referred to as a single crystalline layer because it comprises a plurality of single crystals, as reflected by each of the sections of wings 210 depicted in FIG. 2B. FIG. 2C is an illustration a cross section where the windows 208 have been removed, leaving a plurality of negative spaces 218 where the windows 208 were located. In some embodiments, these voids may be filled or partially filled depending upon the end use of the structure. In other embodiments, the negative spaces 218 may be left unfilled to enhance the flexibility of the assembly. After removing the windows 208, the second semiconductor layer 212 remains as a plurality of single-crystalline structures 214.

Figure 2D:
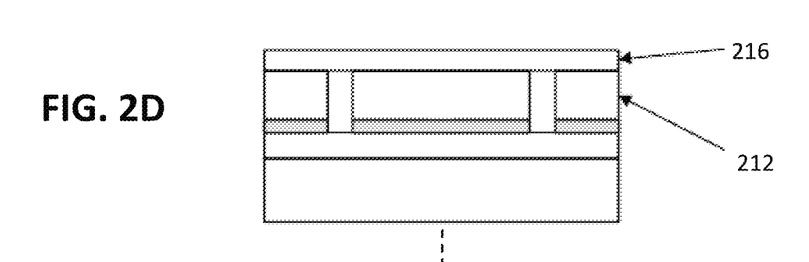
Figure 2E:
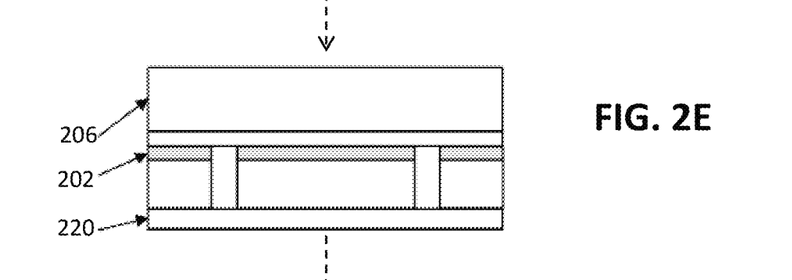

FIG. 2D illustrates a second substrate 216, a flexible substrate, bonded to side of the plurality of single-crystalline structures 214 opposite the side in contact with the mask 202. FIG. 2E illustrates the inverted structure of FIG. 2D. As discussed above, the combination of the mask 202, the semiconductor layer 204, and the semiconductor substrate 206 may be assembled in any order appropriate for the end application and/or manufacturing environment.

Figure 2F:
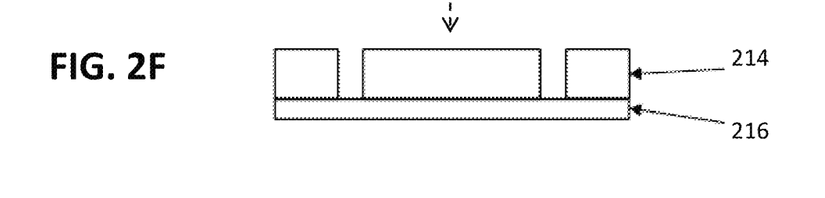

In FIG. 2F, the mask 202 (i.e. the sections of the mask 202) is chemically removed, which also separates the first semiconductor layer 204 (the seed layer) and the first substrate 206 from the plurality of single-crystalline structures 214. The mask 202 may be chemically removed by etching, for example, using hydrofluoric acid (HF). The removal of the mask may be performed in a single etching step or may comprise a plurality of etching cycles which may include rinsing cycles. FIG. 2F illustrates the plurality of single-crystalline structures 214 that has been bonded, directly or indirectly, to the flexible substrate 216. The flexible substrate may comprise a material such as a metallic material, ceramic, glass, polymer, combinations thereof, and may be between about 0.01 mm to about 10 mm thick. The plurality of negative spaces 218 as shown in FIG. 2C that remain after the removal of the windows 208 may enhance the flexibility of the overall structure in addition to the flexible substrate 216.

Figure 3:
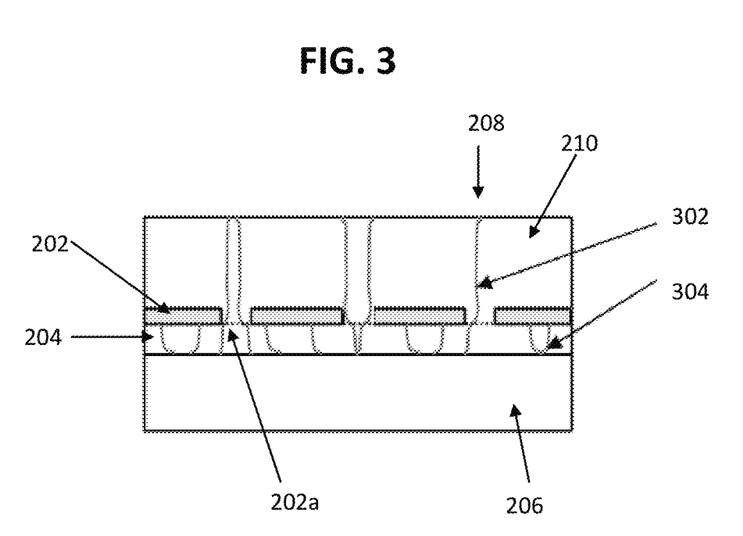
FIG. 3 is an illustration of a cross-sectional structure of semiconductor layers grown by normal epitaxial growth and lateral epitaxial overgrowth.

FIG. 3 is an illustration of a cross-sectional structure of a semiconductor grown by normal epitaxial growth and lateral epitaxial overgrowth. For the case of normal epitaxial growth, a lattice- and thermal-mismatched semiconductor layer 204 is disposed in contact with a different material substrate 206. A plurality of dislocations 304 are generated due to the mismatches during the normal epitaxial growth, as shown in FIG. 3. These dislocations are generally propagated through the layers, as the epitaxial growth proceeds. However, using a proper mask layer 202, the propagation of dislocations can be blocked. While the plurality of dislocations 304 in the area of mask openings 202a, keep propagating through vertical growth area to form the windows 208, the plurality of "wing" regions 210 formed by lateral overgrowth contain very low density of dislocations. The plurality of dislocations 304 propagating towards the mask 202 are blocked by the mask 202 from propagating into due to termination of the epitaxial growth, as shown in FIG. 3. As described, during the lateral epitaxial overgrowth, both vertical 204b and lateral 204a growth processes occur, as shown in FIG. 2A and discussed above. When the growth fronts (e.g., the growth that occurs through openings 202a on opposite sides of a mask 202 portion as indicated in 204a of FIG. 2A) of the lateral overgrowth of neighboring wings 210 meet, a new semiconductor layer 212 is formed as shown in FIG. 2B. A plurality of selected areas of the new semiconductor layer 212 grown by lateral epitaxial overgrowth and a mask 202, that is, a plurality of window areas 208 (e.g., the growth through the plurality of openings 202a as discussed in FIG. 2A) may be removed. In the case of epitaxial growth of a lattice- and thermal-mismatched semiconductor layer 204 on a different substrate 206, the regions (the windows 208) with high dislocation density 302 may be removed.

Figure 4A:
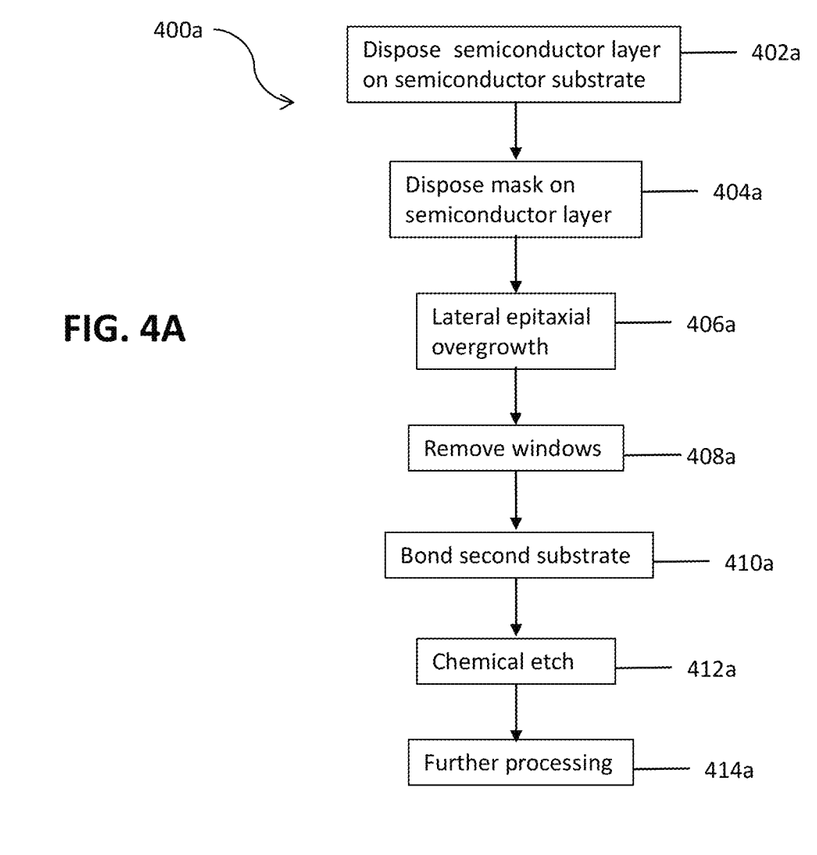
FIGS. 4A-4B are flow charts that illustrate methods of fabricating single-crystalline flexible semiconductors according to certain embodiments of the present disclosure.

FIG. 4A illustrates a method of manufacturing a flexible semiconductor according to certain embodiments of the present disclosure. In method 400a, at block 402a, a semiconductor layer 204 such as shown in FIG. 1 is disposed in contact with a semiconductor substrate 206. The semiconductor substrate 206 may comprise semiconductor glass, metal, ceramic, corundum, or other surfaces that can be employed to grow a single-crystalline structure. In an embodiment, the semiconductor layer 204 may be disposed by chemical vapor deposition (CVD). The types of CVD employed may be, for example, atmospheric pressure (APCVD), low-pressure CVD (LPCVD), plasma-enhanced CVD (PECVD), ultra-high vacuum CVD (UHCVD), aerosol-assisted CVD (AACVD), metal-organic CVD (MOCVD), or other methods as known in the art. The semiconductor layer 204 may be a single-crystalline structure. At block 404a, a mask 202 as discussed in FIG. 1 may be disposed in contact with the semiconductor layer 204 using, for example CVD or pressure vapor deposition (PVD). The mask 202 may comprise a photoresist, which may be negative or positive, a light-sensitive film, an oxide, or a nitride including, respectively, $SiO_2$ or $Si_xN_{1-x}$.

At block 406a, the semiconductor layer 204 may grow through the plurality of openings 202 in between the portions of the mask 202 (as illustrated by 204b in FIG. 2A) to form a plurality of windows 208. The plurality of wings 210 may grow (lateral overgrowth) on the side of the mask 202 that is not in contact with the semiconductor layer 204 around the portions of the mask 202 as shown in 204a of FIG. 2A to form a second semiconductor layer 212. The second semiconductor layer 212 may initially comprise features that will be referred to herein as a plurality of windows 208 and a plurality of wings 210 as illustrated in FIGS. 2B and 3. After the lateral epitaxial overgrowth is sufficiently complete, the plurality of windows 208 may be removed by etching as discussed below. Also as discussed herein with respect to FIG. 3, a plurality of dislocations 304 may form and extend through at least part of the windows. One purpose of the mask 202 is to avoid dislocation propagation. At block 408a, a portion of the second semiconductor layer 212 may be removed.

At block 410a, a second substrate 216 is bonded to the second semiconductor layer by direct or indirect bonding methods. In an embodiment, the direct bonding between a second substrate 216 and the second semiconductor layer is achieved through the use of heat and pressure. In an alternate embodiment, the indirect bonding may employ a bonding agent that may comprise metallic (In—Sn, etc) materials, insulating ($Si_{1-x}N_x$, etc.) materials, or combinations thereof. The second substrate 216 may be from 0.01 mm-10 mm and may comprise ceramic, metallic, glass, polymer, or combinations thereof. At block 412a, the mask 202 is removed, for example, by chemical etching with hydrofluoric acid (HF). As discussed with respect to FIGS. 2E-F, removing the mask also removes the semiconductor layer 204 and the semiconductor substrate 206, leaving the plurality of single crystal structures 214. At block 414a, further processing such as cleaning or further assembly to a semiconductor device 102 as shown in FIG. 1 may occur. In an embodiment, the second substrate 216 may be recycled, that is, may be used in subsequent processes as disclosed herein to fabricate additional flexible semiconductor templates and related devices.

Figure 4B:
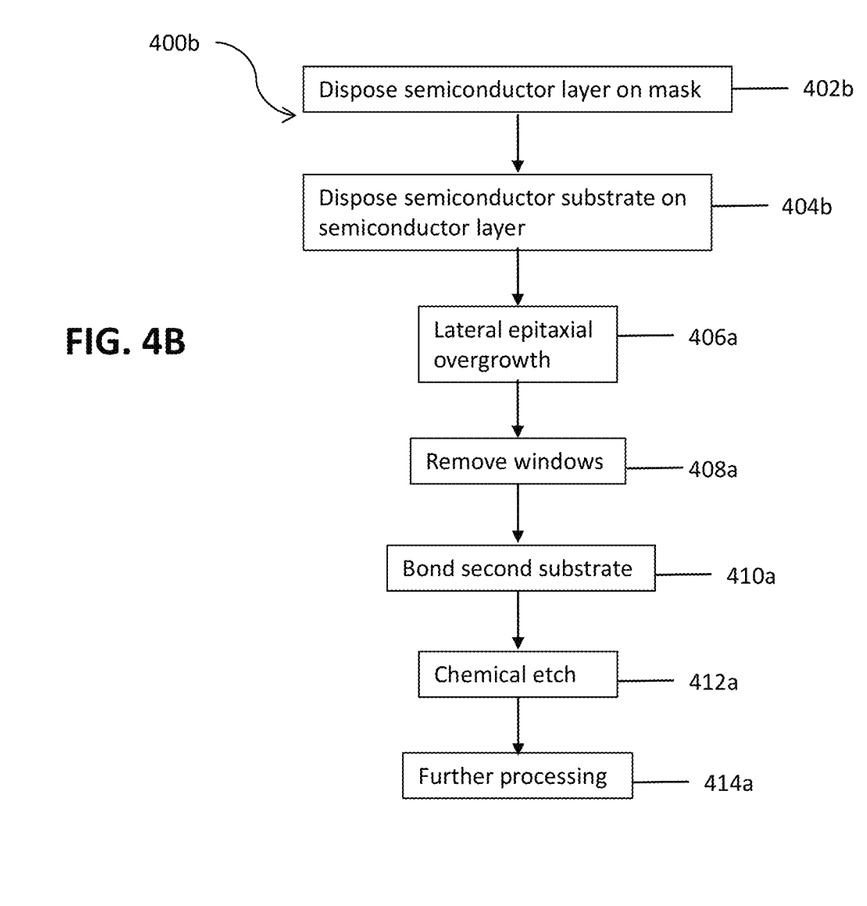

FIG. 4B illustrates a method of manufacturing a flexible semiconductor according to certain embodiments of the present disclosure. In method 400b, at block 402b, a semiconductor layer 204 such as shown in FIG. 1 is disposed in contact with a mask 202. In an embodiment, the semiconductor layer 204 is disposed by chemical vapor deposition (CVD). The types of CVD employed may be, for example, atmospheric pressure (APCVD), low-pressure CVD (LPCVD), plasma-enhanced CVD (PECVD), ultra-high vacuum CVD (UHCVD), aerosol-assisted CVD (AACVD), metal-organic CVD (MOCVD), or other methods as known in the art. The semiconductor layer 204 may be a single-crystalline structure. At block 404a, a semiconductor substrate 206 as discussed in FIG. 1 is disposed in contact with the semiconductor layer 204 using, for example CVD or pressure vapor deposition (PVD). The semiconductor substrate 206 may comprise semiconductor glass, metal, ceramic, corundum, or other surfaces that can be employed to grow a single-crystalline structure. The method 400b in FIG. 4B may then proceed according to blocks 406a-414a in FIG. 4A, resulting in a flexible single-crystalline semiconductor.

Exemplary embodiments are disclosed and variations, combinations, and/or modifications of the embodiment(s) and/or features of the embodiment(s) made by a person having ordinary skill in the art are within the scope of the disclosure. Alternative embodiments that result from combining, integrating, and/or omitting features of the embodiment(s) are also within the scope of the disclosure. Where numerical ranges or limitations are expressly stated, such express ranges or limitations should be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.). For example, whenever a numerical range with a lower limit, $R_l$, and an upper limit, $R_u$, is disclosed, any number falling within the range is specifically disclosed. In particular, the following numbers within the range are specifically disclosed: $R=R_l+k*(R_u-R_l)$, wherein k is a variable ranging from 1 percent to 100 percent with a 1 percent increment, i.e., k is 1 percent, 2 percent, 3 percent, 4 percent, 5 percent, ..., 50 percent, 51 percent, 52 percent, ..., 95 percent, 96 percent, 97 percent, 98 percent, 99 percent, or 100 percent. Moreover, any numerical range defined by two R numbers as defined in the above is also specifically disclosed. Use of broader terms such as "comprises," "includes," and "having" should be understood to provide support for narrower terms such as "consisting of," "consisting essentially of," and "comprised substantially of." Accordingly, the scope of protection is not limited by the description set out above but is defined by the claims that follow, that scope including all equivalents of the subject matter of the claims. Each and every claim is incorporated into the specification as further disclosure, and the claims are exemplary embodiment(s) of the present invention.

While exemplary embodiments of the invention have been shown and described, modifications thereof can be made by one skilled in the art without departing from the scope or teachings herein. The embodiments described herein are exemplary only and are not limiting. Many variations and modifications of the compositions, systems, apparatus, and processes described herein are possible and are within the scope of the invention. Accordingly, the scope of protection is not limited to the embodiments described herein, but is only limited by the claims that follow, the scope of which shall include all equivalents of the subject matter of the claims. Unless expressly stated otherwise, the steps in a method claim may be performed in any order and with any suitable combination of materials and processing conditions.

What is claimed:

1. A method of fabricating semiconductors comprising:
    disposing, using chemical vapor deposition, a first layer in contact with a first substrate;
    disposing, using chemical vapor deposition or pressure vapor deposition, a plurality of mask sections of a mask in contact with a plurality of regions of the first layer, wherein the mask has a first side and a second side, wherein the first side is in contact with the first layer, wherein the second side is opposite the first side, and wherein each pair of adjacent mask sections forms an opening,
    growing, by lateral epitaxial overgrowth through at least some openings formed by the pairs of adjacent mask sections at an angle normal to the mask and on the second side of the mask, a second layer, and wherein at least a portion of the second layer comprises a single crystalline structure of a plurality of single crystals;
    removing, via chemical etching, at least a portion of the second layer, wherein the removed portion is part of the second layer that grew through an least one opening of the plurality of openings;
    bonding, via direct or indirect bonding, a second substrate to the second layer, wherein the second substrate is a flexible substrate, wherein the direct bonding comprises heat and pressure and the indirect bonding is via at least one metallic material, or at least one insulating material, or a combination of at least one metallic material and one insulating material;
    removing, via chemical etching, the mask and the first layer; and
    removing, via chemical etching, the first substrate.

2. The method of claim 1, wherein the first layer and the second layer each comprise at least one of Si, Ge, SiGe, GaAs, GaP, AlN, GaN, GaSb, InP, and InAs.

3. The method of claim 1, wherein the mask comprises at least one of a photoresist, a light-sensitive film, an oxide, or a nitride.

4. The method of claim any of the above, wherein the first substrate comprises at least one semiconductor, wherein the semiconductor comprises at least one of germanium, GaAs, InP, GaSb, InAs, SiC, corundum, ceramic, glass, metallic material, and combinations thereof.

5. The method of claim any of the above, wherein the second substrate comprises at least one of nickel (Ni), copper (Cu), stainless steel, and ceramic, as well as alloys and combinations thereof.

6. The method of claim 5, wherein the second substrate is between 0.01 mm and 5 mm thick.

7. The method of claim any of the above, further comprising: removing the mask via etching using hydrofluoric acid (HF).

8. The method of claim any of the above, wherein removing the first substrate forms a semiconductor template.

9. The method of claim any of the above, further comprising:
    recycling the second substrate, wherein recycling the second substrate comprises reusing, subsequent to removing, the second substrate to form a different semiconductor template.

10. The method of claim 9, further comprising incorporating a semiconductor device into the semiconductor template using at least one of deposition, diffusion, implantation, and combinations thereof, wherein the semiconductor device comprises a plurality of at least one of layers and regions of different materials.

* * * * *